United States Patent
Nast et al.

(10) Patent No.: US 9,602,148 B2
(45) Date of Patent: Mar. 21, 2017

(54) COMPENSATION FOR A SIGNAL DAMPING WHILE TRANSMITTING TRANSMISSION SIGNALS OF A WIRELESS MOBILE DEVICE

(71) Applicant: NOVERO DABENDORF GMBH, Dabendorf (DE)

(72) Inventors: Helmut Nast, Berlin (DE); Raimo Jacobi, Berlin (DE)

(73) Assignee: Novero Dabendorf GmbH, Dabendorf (DE)

( * ) Notice: Subject to any disclaimer, the term of this patent is extended or adjusted under 35 U.S.C. 154(b) by 0 days.

(21) Appl. No.: 14/888,148

(22) PCT Filed: Apr. 29, 2014

(86) PCT No.: PCT/EP2014/058713
§ 371 (c)(1),
(2) Date: Oct. 30, 2015

(87) PCT Pub. No.: WO2014/177556
PCT Pub. Date: Nov. 6, 2014

(65) Prior Publication Data
US 2016/0049969 A1    Feb. 18, 2016

(30) Foreign Application Priority Data

Apr. 30, 2013   (DE) .................. 10 2013 207 898

(51) Int. Cl.
*H04B 1/04*   (2006.01)
*H01Q 11/12*   (2006.01)
(Continued)

(52) U.S. Cl.
CPC ......... *H04B 1/0475* (2013.01); *H03G 3/3042* (2013.01); *H03F 1/0244* (2013.01); *H04B 2001/045* (2013.01); *H04B 2001/0416* (2013.01)

(58) Field of Classification Search
CPC ...... H03G 3/3042; H03G 11/00; H03G 11/08; H04B 2001/0416; H04B 2001/0433;
(Continued)

(56) References Cited

U.S. PATENT DOCUMENTS

| 4,776,032 A | 10/1988 | Odate et al. |
| 5,196,808 A * | 3/1993 | Pickett ................. H04B 1/0466 330/207 P |

(Continued)

FOREIGN PATENT DOCUMENTS

| DE | 69824873 T2 | 6/2005 |
| DE | 102007029952 A1 | 1/2009 |

(Continued)

*Primary Examiner* — Duc M Nguyen
(74) *Attorney, Agent, or Firm* — Laurence A. Greenberg; Werner H. Stemer; Ralph E. Locher (57) ABSTRACT

A circuit arrangement compensates for signal damping while transmitting transmission signals of a wireless mobile device. The circuit arrangement contains an adjustable signal level amplifying device which has a signal amplifier for amplifying the transmission signals with a signal amplification generated by the signal amplifier. The circuit further has an adjusting device for adjusting a resulting signal amplification, and a detector arrangement which detects whether a signal level of the transmission signal of the mobile device has exceeded an upper threshold and whether the signal level has reached a lower threshold. The detector arrangement causes the adjusting device to reduce the resulting signal amplification generated by the signal level amplifying device if the signal level has reached the upper threshold. The detector arrangement causes the adjusting device to reduce the resulting signal amplification generated by the signal level amplifying device if the signal level has fallen below the lower threshold.

14 Claims, 6 Drawing Sheets

(51) Int. Cl.
*H03G 3/30* (2006.01)
*H03F 1/02* (2006.01)

(58) Field of Classification Search
CPC ............ H04B 2001/045; H03F 1/0244; H03F 1/0255; H03F 1/08; H03F 1/26; H03F 1/32
USPC .................................. 455/126, 127.2, 114.3
See application file for complete search history.

(56) References Cited

U.S. PATENT DOCUMENTS

| | | | |
|---|---|---|---|
| 5,513,387 A | 4/1996 | Saito et al. | |
| 5,886,575 A | 3/1999 | Long | |
| 6,055,418 A * | 4/2000 | Harris | H01P 1/2138 330/124 R |
| 6,104,919 A | 8/2000 | Lyall, Jr. et al. | |
| 6,229,389 B1 * | 5/2001 | Pullen | H03F 1/523 330/10 |
| 6,710,646 B1 * | 3/2004 | Kimball | H03F 1/0222 330/10 |
| 7,221,967 B2 | 5/2007 | Van Buren et al. | |
| 7,783,318 B2 | 8/2010 | Wilson et al. | |
| 8,238,984 B2 | 8/2012 | Pursche et al. | |
| 9,037,201 B2 | 5/2015 | Holz et al. | |
| 2001/0023190 A1 | 9/2001 | Kim | |
| 2004/0110477 A1 * | 6/2004 | Nishimura | H04W 52/12 455/127.1 |
| 2005/0186923 A1 * | 8/2005 | Chen | H04W 52/343 455/127.1 |
| 2007/0218951 A1 | 9/2007 | Risheq et al. | |
| 2008/0058026 A1 | 3/2008 | Jeong | |
| 2008/0112712 A1 * | 5/2008 | Inoue | H03F 3/087 398/208 |
| 2008/0223931 A1 * | 9/2008 | Spiess | G06K 7/0008 235/439 |
| 2009/0093225 A1 * | 4/2009 | Fan | H03F 1/0211 455/127.2 |
| 2015/0035507 A1 * | 2/2015 | Cowley | G05F 1/46 323/282 |

FOREIGN PATENT DOCUMENTS

| | | |
|---|---|---|
| WO | 9710649 A1 | 3/1997 |
| WO | 2007118694 A1 | 10/2007 |
| WO | 2012010560 A1 | 1/2012 |

* cited by examiner

COMPENSATION FOR A SIGNAL DAMPING WHILE TRANSMITTING TRANSMISSION SIGNALS OF A WIRELESS MOBILE DEVICE

BACKGROUND OF THE INVENTION

Field of the Invention

The invention relates to a circuit arrangement and a method for compensating for a signal damping while transmitting transmission signals of a wireless mobile device. The invention also relates optionally to the compensation for a signal damping while transmitting reception signals of the wireless mobile device.

It is known, e.g. from WO 2007/118694 A1, to couple a mobile telephone wirelessly via an antenna structure to devices of a motor vehicle, in particular to an external antenna of the motor vehicle. The transmission and reception signals of the wireless mobile device are transmitted and received via the external antenna. The quality of the radio link can be significantly increased as a result.

The invention relates, in particular, to a circuit arrangement for transmitting transmission and reception signals of a wireless mobile device (e.g. a mobile telephone, a smartphone or an emergency transmitter), which are used in motor vehicles. However, a circuit arrangement which, in particular, has a wireless signal coupling device as essentially described in WO 2007/118694 A1 can also be used in a stationary manner, e.g. in buildings in order to transmit signals e.g. via an external antenna on the building in a mobile network or via a mobile radio link and thus improve the transmission quality compared with the exclusive use of the antenna of the wireless mobile device.

A circuit arrangement with the wireless signal coupling device already mentioned is the main application of the invention. A coupling device of this type simplifies the handling of wireless mobile devices, since no line connection (i.e., in particular, a cable connection) to the wireless mobile device needs to be established in order to be able to operate it in combination with the circuit arrangement. However, also in other circuit arrangements for transmitting transmission signals from wireless mobile devices which are used in addition to the wireless mobile device, an additional signal damping which is caused by the circuit arrangement and optionally by the additional components may occur due to the circuit arrangement or additional components optionally connected to it. In particular, high-frequency lines for transmitting the signals within the circuit arrangement, frequency filters, frequency separating filters, detectors contribute to the additional signal damping.

As long as the additional signal damping is temporally constant, it can be compensated for in a simple manner by means of a signal amplifier with a corresponding, constant amplification factor which re-amplifies the signals and thus compensates for the damping. In contrast to repeaters, also referred to as translators, it is not desirable to increase the signal level above the level which the signal has directly on the transmit antenna of the wireless mobile device (in relation to the transmission signals of the device) or directly on the external antenna (in relation to the signals received from the mobile network). This would be disadvantageous as it would interfere with the alignment of the transmitted and received power that takes place between the wireless mobile device and a mobile station of the mobile network or the mobile link. Either the alignment would be hindered or adversely affected or an alignment of these powers or signal levels would have to be carried out by the circuit arrangement itself through communication with the wireless mobile device and the mobile station. This would incur a high circuitry cost.

In the aforementioned type of circuit arrangements, which, in combination with the respective wireless mobile device, cause a different additional signal damping depending on the state of the combination, the objective of the most exact possible compensation of the additional signal damping is not achievable with a constant signal amplification that is identical for each possible state. It is conceivable to determine the additional signal damping in each of the possible states of the combination and to set the signal amplification accordingly. However, since wireless mobile devices, as mentioned, transmit their transmission signals with variable transmitted power, depending on the result of the alignment with the mobile station, the determination of the additional signal damping is not possible or in turn requires an alignment with the wireless mobile device. For example, the wireless mobile device would have to transmit a transmission signal with a predefined or known transmitted power in a time period that is known to the circuit arrangement. The problem here is also that the state of the coupling between the wireless mobile device and the circuit arrangement may change in an unforeseen and unknown manner, resulting in a change in the additional signal damping.

For example, the wireless mobile device as described in WO 2007/118694 A1 or in WO 2012/010560 A1 can be placed in different positions and alignments on a support surface in order to bring the transmit and receive antenna of the wireless mobile device close to an antenna structure of the circuit arrangement, wherein the antenna structure forms at least a part of a wireless signal coupling device. During the operation of the wireless mobile device, the transmission and reception signals (high-frequency signals for the operation in the mobile network) are transmitted wirelessly between the transmit and receive antenna of the wireless mobile device and the antenna structure. Due to the different positions and alignments, the signal damping caused by the wireless coupling differs, so that the additional signal damping also varies on the whole.

BRIEF SUMMARY OF THE INVENTION

One object of the present invention is to indicate a circuit arrangement and a method for compensating for a signal damping while transmitting transmission signals of a wireless mobile device which, with variable signal damping that is caused by the combination of the wireless mobile device with the circuit arrangement, effect a compensation for the additional signal damping so that a setting of the signal levels negotiated between the wireless mobile device and a remote mobile station is not adversely affected during the operation of the wireless mobile device.

One finding of the present invention is that the circuit arrangement acts in combination with the wireless mobile device and also with other influencing factors in the transmission of radio signals in mobile systems. On the other hand, however, the influence of the circuit arrangement is not intended, as in the case of some other influencing factors (e.g. obstacles to the propagation of radio waves) to result in interference with the signal transmission leading to a disconnection of the radio link.

A signal amplification is therefore intended to take place as at least partial compensation for the additional signal damping, which does not, however, generally compensate for the additional signal damping to zero, even if this case can occur.

An essential basic concept of the invention consists in leaving the resulting signal amplification of the transmission signals unchanged in a defined, in particular predefined, range of signal levels and in modifying it only if limit values of the range are reached or exceeded or understepped. Through this adaptation, it is achieved, on the one hand, that the alignment of signal levels between the wireless mobile device and the mobile station is not adversely affected and, on the other hand, maximum values for permissible signal levels are not, or are not substantially, exceeded (particularly within the constraints of the permissible tolerances). It is furthermore achieved that a reduction in the transmitted power of the wireless mobile device results in any event in a reduction in the signal level to the minimum value of the signal level, i.e. the mobile station and the wireless mobile device can also negotiate the transmission levels with one another close to the permissible minimum value.

A specific embodiment is described below in which any required adaptation of the resulting signal amplification is effected by setting the signal damping of a damping device. However, the aforementioned basic principles can be implemented in a different manner also. In particular, alternatively or additionally to the setting of the signal damping, the signal amplification of at least one signal amplifier can be set directly.

If a damping device is used, the signal amplification of a signal amplifier of the circuit arrangement can be set to a constant value at least over a predefined time period of the operation of the wireless mobile device or during the entire operating time period. This offers the advantage that the signal amplifier can be manufactured simply and economically. The resulting signal amplification is then derived from the constant signal amplification of the signal amplifier, minus the signal damping of a settable damping device. This damping device may be settable continuously within a range of signal damping values. However, a damping device with discrete predefined damping values which are settable is preferred. For example, a damping component can be connected or disconnected through the control of switches. In any case, a damping device with discrete predefined damping values simplifies a digital control, i.e. setting of the signal damping, implemented, in particular, by means of microcontrollers. However, it is also possible in principle to set both the damping of a damping device and the amplification of a signal amplifier in order to set the resulting signal amplification.

Independently from the implementation of the settable resulting amplification, the resulting signal amplification is reduced on reaching or exceeding an upper limit value for the signal level of the mobile signals. A maximum value for the high-frequency signals present at the signal output of the circuit arrangement can thereby be adhered to.

However, a further essential finding of the invention is based on the fact that, even on reaching or understepping an lower limit value of the signal level, the resulting signal amplification is reduced. The reason for this (as mentioned above) is that, in a signal level range which essentially lies (with the exception, where relevant, of a hysteresis in the range of the upper and lower limit value) between the lower and upper limit value of the signal level, no modification of the resulting signal amplification is carried out. A wireless mobile operation which, from the perspective of the wireless mobile device and the mobile station, has no differences compared with the operation of the wireless mobile device without the circuit arrangement, can therefore take place within this range. However, since the instantaneous additional signal damping is not known, the set resulting signal amplification may be too great in the specified signal level range between the lower limit value and the upper limit value. If the wireless mobile device attempts to reduce further the signal level in an operating situation of this type (e.g. because signals with an excessively high power arrive in the receiver of the mobile station), a minimum value of the wireless mobile device or of the mobile station for the transmitted signal level or the transmitted power may already have been reached. This would also not be required without the circuit arrangement. However, since the resulting signal amplification of the circuit arrangement is too great in the assumed operating state, the mobile station requires the signal level to be further reduced, e.g. by the wireless mobile device, although, from the perspective of the wireless mobile device, this is no longer permissible or possible. The resulting signal amplification is therefore reduced according to the invention when the lower limit value for the signal level is reached or understepped. In the preferred embodiment, this is achieved by setting the signal damping of the settable damping device to a greater value than previously.

Particularly if the upper limit value and the lower limit value of the signal level have been set accordingly, the output power of the circuit arrangement can be set in all operating situations in the entire range between its maximum value and its minimum value. The dynamic range required for the operation of the wireless mobile device is therefore adhered to.

In particular, the following is proposed: A circuit arrangement for compensating for a signal damping while transmitting transmission signals of a wireless mobile device, wherein the circuit arrangement has:

a settable signal level amplification device which has at least one signal amplifier for amplifying the transmission signals with a signal amplification generated by the signal amplifier, a setting device for setting a resulting signal amplification generated by the signal level amplification device, a detector arrangement which is designed to detect whether a signal level of the transmission signals of the wireless mobile device reaches or exceeds a predefined upper limit value and whether the signal level reaches or understeps a predefined lower limit value, wherein a) the detector arrangement and the setting device are interconnected, b) if the upper limit value is reached or exceeded, the detector arrangement is designed to cause the setting device to reduce the resulting signal amplification generated by the signal level amplification device, and c) if the lower limit value is reached or understepped, the detector arrangement is designed to cause the setting device to reduce the resulting signal amplification generated by the signal level amplification device.

The following is furthermore proposed: A method for compensating for a signal damping in the transmission of transmission signals of a wireless mobile device, wherein:

the signals are amplified with a signal amplification generated by the signal amplifier, the resulting signal amplification generated by a settable signal level amplification device which has at least the signal amplifier is set depending on a signal level of the transmission signals of the wireless mobile device, it is detected whether the signal level reaches or exceeds a predefined upper limit value and whether the signal level reaches or understeps a predefined lower limit value, wherein,
- a) if the upper limit value is reached or exceeded, the resulting signal amplification generated by the signal level amplification device is reduced, and,
- b) if the lower limit value is reached or understepped, the resulting signal amplification generated by the signal level amplification device is reduced.

The signal level amplification device preferably has a damping device. The resulting signal amplification is then derived from the signal amplification of the signal amplifier, minus the damping of the damping device. In particular, the resulting signal amplification is increased in this case by reducing the signal damping generated by the damping device.

The circuit arrangement for compensating for a signal damping in the transmission of transmission signals of a wireless mobile device therefore preferably has:
- a signal amplifier to amplify the signals with a signal amplification generated by the signal amplifier,
- a damping device which is combined with the signal amplifier in such a way that the signals are amplified according to a resulting amplification which results from the generated signal amplification of the signal amplifier and from a signal damping generated by the damping device, wherein the signal damping generated by the damping device is settable,
- a setting device to set the signal damping generated by the damping device,
- a detector arrangement which is designed to detect whether a signal level of the transmission signals of the wireless mobile device reaches or exceeds a predefined upper limit value or whether the signal level reaches or understeps a predefined lower limit value, wherein
- a) the detector arrangement and the setting device are interconnected,
- b) if the upper limit value is reached or exceeded, the detector arrangement is designed to cause the setting device to increase the signal damping generated by the damping device, and
- c) if the lower limit value is reached or understepped, the detector arrangement is designed to cause the setting device to increase the signal damping generated by the damping device.

This is matched by a preferred design of the method for compensating for a signal damping in the transmission of transmission signals of a wireless mobile device, wherein:
- the signals are amplified with a signal amplification generated by a signal amplifier,
- the signals are furthermore damped by a damping device so that the signals are amplified according to a resulting amplification which results from the generated signal amplification of the signal amplifier and from a signal damping generated by the damping device,
- the signal damping generated by the damping device is set depending on a signal level of the transmission signals of the wireless mobile device,
- it is detected whether the signal level reaches or exceeds a predefined upper limit value, and whether the signal level reaches or understeps a predefined lower limit value, wherein
- a) if the upper limit value is reached or exceeded, the signal damping generated by the damping device is increased, and
- b) if the lower limit value is reached or understepped, the signal damping generated by the damping device is increased.

The reaching or exceeding of the upper limit value for the signal level and the reaching or understepping of the lower limit value of the signal level can be detected at various locations in relation to the signal path within the circuit arrangement. It is preferred that the detection of transmission signals of the wireless mobile device takes place in the signal path between the settable damping device and the signal amplifier connected downstream in the signal flow direction. In any case, it is preferred that the signal level is detected with the detection of transmission signals of the wireless mobile device in the signal flow direction upstream of the signal amplifier.

If both the transmission and reception signals of the wireless mobile device are transmitted via the same circuit arrangement and, in particular, via at least sections of the same high-frequency line of the circuit arrangement and a compensation for the additional signal damping is to take place in each case, it is preferred to detect the signal level only for transmission signals of the wireless mobile device. In this case, it can be assumed that the additional signal damping is identical for the transmission signals and the reception signals. The resulting signal amplification can therefore be set on the basis of the detected signal level or the detection that the upper limit value is reached or exceeded or the lower limit value is reached or understepped, in fact in the same way for the transmission signals and the reception signals. In particular, the transmission of both the transmission signals and the reception signals can take place via the same signal path of the signal-damping device.

The circuit arrangement is preferably designed to increase the signal amplification of the signal level amplification device if the signal level has again understepped the upper limit value. In particular, the circuit arrangement is designed to increase and to reduce the resulting signal amplification in the range of the upper limit value according to a hysteresis. The resulting signal amplification thus shows the behavior of a hysteresis depending on the signal level, i.e. it also depends on its previous state. It is thereby achieved that the resulting signal amplification can remain temporally stable in a range of the signal level around the upper limit value, i.e. it does not understep the upper limit value due to a reduction in the resulting signal amplification and is therefore immediately increased once more, etc. A design of the circuit arrangement is therefore preferred in which the upper limit value is a first upper limit value and the circuit arrangement is designed to increase the resulting signal amplification generated by the signal level amplification device if the detector arrangement detects that the signal level of the transmission signals of the wireless mobile device reaches or understeps a second predefined upper limit value which lies below the first upper limit value but above the lower limit value (or in the case of a plurality of lower limit values above all lower limit values).

In particular, the resulting signal amplification is set (e.g. in a stepwise manner or continuously) to its greatest settable value, preferably by setting the signal damping of the damping device to its smallest settable value before the signal level reaches the lower limit value for the first time or for the first time again after the resulting signal amplification has been reduced after reaching or exceeding the upper limit value.

The greatest settable value of the resulting signal amplification is the greatest value to which the setting device can set the signal level amplification device during the operation of the wireless mobile device. The smallest settable value of the signal damping is the smallest value to which the setting device can set the damping device during the operation of the wireless mobile device. It is therefore not excluded that the signal level amplification device is set to a basic value of the resulting signal amplification which is smaller than a different possible setting value of the resulting signal amplification of the signal level amplification device before the operation of the wireless mobile device. The basic value is set, for example, so that a basic amplification which is adapted to an expected operating situation of the wireless mobile device results from a temporally constant amplification of the signal amplifier and the basic value of the damping device. However, the basic value is not modified during the operation of the wireless mobile device and thus represents the greatest settable value of the resulting signal amplification or the smallest settable value of the signal damping.

The circuit arrangement is preferably designed to increase the resulting signal amplification generated by the signal level amplification device if the signal level has again exceeded the lower limit value. In particular, the circuit arrangement is designed to increase and reduce the resulting signal amplification in the range of the lower limit value according to a hysteresis. The resulting signal amplification thus shows the behavior of a hysteresis depending on the signal level, i.e. it also depends on its previous state. It is thereby achieved that the resulting signal amplification can remain temporally stable in a range of the signal level around the lower limit value, i.e. it does not understep the lower limit value due to a reduction in the resulting signal amplification and is therefore immediately increased once more, etc. A design of the circuit arrangement is therefore preferred in which the lower limit value is a first lower limit value and the circuit arrangement is designed to increase the resulting signal amplification generated by the signal level amplification device if the detector arrangement detects that the signal level of the transmission signals of the wireless mobile device reaches or exceeds a second predefined lower limit value which lies above the first lower limit value but below the upper limit value (or in the case of a plurality of upper limit values below all upper limit values).

In particular, the resulting signal amplification is set (e.g. in a stepwise manner or continuously) to its greatest settable value, preferably by setting the signal damping of the damping device to its smallest settable value before the signal level reaches the upper limit value for the first time or for the first time again after the resulting signal amplification has been reduced after reaching or understepping the lower limit value.

It is normally predefined through corresponding standards that the signal level of the transmission signals transmitted by a wireless mobile device must lie within a specific signal level range in the operation of the wireless mobile device in a mobile network, i.e. it must be able to reach a minimum value and must not exceed a maximum value. The circuit arrangement can be configured using this information.

The term "additional signal damping" is used below. This is to be understood to mean the (not yet compensated) signal damping with which the transmission signals of the wireless mobile device are damped by means of the circuit arrangement due to the transmission of the signals. Further components which are involved in the transmission of the signals and therefore also in a damping of the signals are optionally connected to the circuit arrangement. In this case, the additional signal damping is the sum of the signal damping caused by the circuit arrangement and the further components. The signal damping is "additional" because it does not occur in an operation of a wireless mobile device without the circuit arrangement and without the optionally present further components. However, particularly in the operation of a wireless mobile device within a motor vehicle, a poor transmission quality would be expected without the circuit arrangement and the optionally present further components (in particular a high-frequency line to an external antenna of a motor vehicle). Since the additional signal damping is a damping that is not yet compensated, the signal amplification and the optional signal damping of the settable signal level amplification device are not included among the components which cause the additional signal damping.

In order to compensate for an additional signal damping of the type that occurs, for example, in the use of a wireless signal coupling device, the maximum value of the additional signal damping and the minimum value of the additional signal damping are determined and/or defined. In the case of the wireless signal coupling device, at least its minimum contribution to the additional signal damping, for example, can be determined. Its maximum contribution to the additional signal damping is generally not limited. However, signal coupling devices exist in the operation of which the coupled wireless mobile device must be located in a defined spatial area, for example because it is placed on a limited support surface of the signal coupling device. The maximum contribution to the additional signal damping can also be determined in these cases. Otherwise, the maximum amount can be defined, so that an operation of the wireless mobile device that is usable in terms of transmission quality can still take place.

In the case of the wireless signal coupling device, the additional signal damping also contains damping constituents which can be attributed to other components of the circuit arrangement and parts connected thereto (such as, for example, an antenna and a high-frequency line for the signals). However, these damping constituents are normally constant, i.e. they do not depend, in particular, on the type of wireless mobile device and the arrangement of the wireless mobile device in relation to the circuit arrangement. In the case of a wireless signal coupling device, on the other hand, its contribution to the additional signal damping depends on the type and arrangement of the wireless mobile device.

The smallest value of the resulting signal amplification of the signal level amplification device that is settable during the operation of the wireless mobile device, referred to below as the smallest settable value of the resulting signal amplification for short, is, in particular, defined and therefore predefined in such a way that it lies below the greatest settable value of the resulting signal amplification of the signal level amplification device by the amount of the difference between the maximum value and the minimum value of the additional signal damping.

Particularly in the case where the resulting signal amplification is set by the signal damping of the damping device, the greatest settable value of the signal damping is, in particular, defined and therefore predefined in such a way that it lies above the smallest settable value of the signal damping of the damping device by the difference between the maximum value and the minimum value of the additional signal damping. Furthermore, the signal amplification of the signal amplifier that is temporally constant during the operation of the wireless mobile device and the circuit arrangement is, in particular, defined and therefore predefined in such a way that it corresponds to the maximum value of the additional signal damping, i.e. the maximum additional signal damping is compensated to zero.

The upper limit value of the signal level on the detector arrangement or the upper limit value for the detected signal level is furthermore defined in such a way that the upper limit value is equal to the signal level that is present on the signal output of the circuit arrangement if the additional signal damping has its maximum value. In particular, the signal output of the circuit arrangement is the signal output via which transmission signals of the wireless mobile device are transmitted into a mobile network, for example to a base station of the mobile network.

The signal output on the mobile network side is formed, in particular, by a transmit antenna of the circuit arrangement, wherein the signal damping caused by the transmit antenna in combination with the high-frequency line is taken into account in the additional signal damping which is to be compensated. Transmission signals, for example, of the wireless mobile device are transmitted with the transmit antenna to a base station of a mobile network. The transmit antenna is normally also the receive antenna with which reception signals of the wireless mobile device are received from the mobile network and are transmitted from there via the high-frequency line to the wireless mobile device.

Furthermore, the lower limit value of the signal level on the detector arrangement or the lower limit value for the detected signal level is defined in such a way that the lower limit value is equal to the signal level that is present at the signal output of the circuit arrangement, minus the amount of the difference between the maximum value and the minimum value of the additional signal damping if the additional signal damping has its minimum value. In other words, the lower limit value of the signal level lies above the minimum value of the permissible signal level for the operation of wireless mobile devices by the amount of the difference between the maximum value and the minimum value of the additional signal damping. In the case of transmission signals, this permissible signal level applies, as mentioned above, to the antenna via which the transmission signals are transmitted into the mobile network. This antenna is, in particular, part of the circuit arrangement.

As mentioned, the signal level amplification device (in particular the damping device) may be a digital device, the resulting signal amplification (in particular the signal damping) of which can be increased and reduced in a stepwise manner by the setting device. This is matched by a design of the method in which the signal level amplification device has predefined, discrete values of the resulting signal amplification and the resulting signal amplification is increased and reduced in a stepwise manner according to differences in these discrete values.

In particular, the circuit arrangement can have a signal-coupling device which is designed to inject transmission signals of a transmit antenna of the wireless mobile device into a high-frequency line for the line-connected transmission of the transmission signals, and preferably also to decouple reception signals which are transmitted via the high-frequency line to the signal-coupling device from the high-frequency line and transmit them wirelessly to a receive antenna of the wireless mobile device. It has already been mentioned that WO 2007/118694 A1 describes example embodiments of a circuit arrangement of this type. However, a further example embodiment of a signal-coupling device of this type is e.g. a bracket for a wireless mobile device which holds the wireless mobile device in an upright position, wherein the position of the wireless mobile device in relation to the bracket can vary in some of these brackets. Even if the position is not variable, some of these brackets can hold not only one type of wireless mobile device, but different types. If a bracket of this type has a wireless signal-coupling device, the additional signal damping which is caused to a substantial extent by the combination (coupling) of the wireless mobile device via the signal-coupling device with the circuit arrangement varies in all these cases.

The circuit arrangement may have a transmit antenna (which is e.g. a transmit and receive antenna and/or an external antenna of a motor vehicle) which is connected via the high-frequency line to the signal-coupling device and via which the transmission signals of the wireless mobile device which are injected by the signal-coupling device into the high-frequency line and are amplified with the resulting amplification are transmitted during the operation of the wireless mobile device. In addition, the circuit arrangement may have a receive antenna which is connected via a high-frequency line to the signal-coupling device and by which reception signals of the wireless mobile device are received during the operation of the wireless mobile device, said reception signals being transmitted from the receive antenna via the high-frequency line to the signal-coupling device and, amplified with the resulting amplification, being decoupled by the signal-coupling device and transmitted wirelessly to the receive antenna of the wireless mobile device. The receive antenna and the transmit antenna are preferably the same antenna.

Particularly if the antenna of the circuit arrangement is a transmit and receive antenna, a transmission of both the transmission signals and the reception signals of the wireless mobile device can be carried out via a single high-frequency line. This does not exclude the possibility that, in individual sections of the signal path, a separate transmission of the transmission signals and the reception signals can also take place in separate line sections. In particular, both the transmission amplifier and an additional reception amplifier are present to amplify the reception signals, so that the line sections of the amplifiers are separate line sections exclusively for the transmission signals or the reception signals. Alternatively, it is obviously possible for the circuit arrangement to have a high-frequency line that is continuous between the signal input and the signal output exclusively for transmission signals and a high-frequency line that is continuous between the signal input and the signal output exclusively for reception signals of the wireless mobile device, wherein the signal inputs and signal outputs are different for the transmission and reception signals. In the case of a common high-frequency line for transmission signals and reception signals, the signal output, for example, for the transmission signals and the signal input for the reception signals are located on the transmit and receive antenna of the circuit arrangement which serves for the immediate communication in the mobile network or via the mobile link. Conversely, the signal output, for example, for the reception signals and the signal input for the transmission signals are located on the wireless signal-coupling device via which the circuit arrangement is coupled to the wireless mobile device. Obviously, the wireless mobile device itself does not belong to this circuit arrangement.

In particular, the circuit arrangement can be equipped to be operated in combination with a wireless mobile device, wherein the mobile signals may lie in different frequency bands depending on the mobile standard. More generally formulated, the circuit arrangement is suitable, in particular, for operation at signal frequencies in different high-frequency bands. At least one frequency band, for example, is allocated in each case in the different known mobile standards. A universal circuit arrangement for operation in central Europe must, for example, be suitable for signal frequencies in eight different frequency bands.

The circuit arrangement may therefore optionally have parallel signal paths and/or individual circuit components that are suitable or used only for operation in one of the possible frequency bands. Corresponding designs of circuit arrangements of this type are known per se. In relation to the invention, this means that a plurality of signal amplifiers and/or settable damping devices can be provided for the different frequency bands and/or the individual signal paths. However, it is preferred, at least for the signal amplifier, that it amplifies high-frequency signals not only in one frequency band, but in a plurality of frequency bands, i.e. it is usable in the operation of the circuit arrangement according to different mobile standards. This does not necessarily mean that the same signal amplifier is used for all possible mobile standards or frequency bands. It preferably applies similarly to the settable damping device that it is used for the damping of the signal level of signals in different frequency bands and/or according to different mobile standards.

If the same signal amplifier is used for signals in different frequency bands, the amplification factor may depend slightly on the frequency and may therefore vary for the different frequency bands. This can be equalized, for example, in that a damping component of the settable damping device is continuously switched on, i.e. active, for operation in one frequency band in which the signal amplification of the signal amplifier is greater than in another frequency band. This damping component is not then available during operation for the setting of the signal damping. It may also be appropriate to comply with the different rules in the different mobile standards for the maximum signal level and the minimum signal level of transmission and/or reception signals in that one or more damping components of the settable damping device are switched on (i.e. active) or switched off (i.e. inactive) before or at the beginning of operation, in fact for the entire operating period according to the respective mobile standard. Individual damping components of the settable damping device can also remain continuously switched off during the entire operating period according to one specific mobile standard, so that the difference between the greatest settable signal damping and the smallest settable signal damping during operation is definable. This difference can also be defined in the same way as a different value if a different wireless mobile device than before is operated in combination with the circuit arrangement.

BRIEF DESCRIPTION OF THE SEVERAL VIEWS OF THE DRAWING

Example embodiments of the invention will now be described with reference to the attached drawing. In the individual figures of the drawing.

DESCRIPTION OF THE INVENTION

Figure 1:
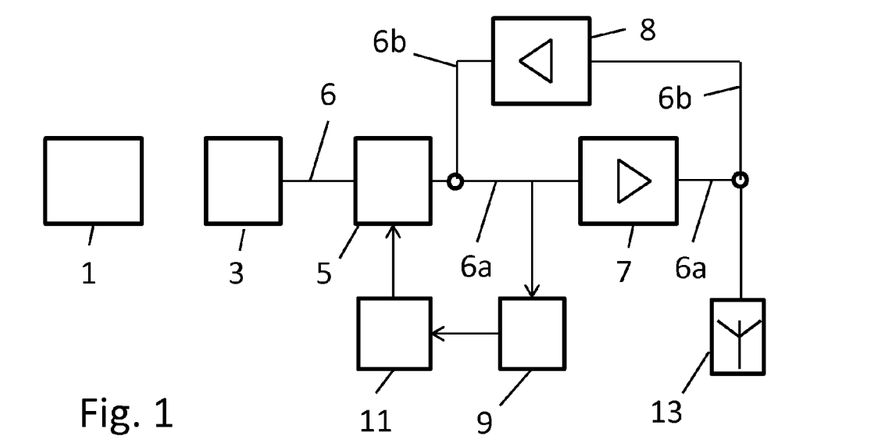
FIG. 1 shows a circuit arrangement with a wireless signal coupling device, a settable damping device, a signal amplifier, a detection device and a setting device for setting the damping device and a transmit and receive antenna, wherein the circuit arrangement is combined with a wireless mobile device.

The circuit arrangement shown in FIG. 1 has a wireless signal-coupling device 3, a settable damping device 5, a transmission signal amplifier 7 and an antenna 13 which are arranged in this sequence in the signal path for transmission signals of a wireless mobile device 1. Sections of a corresponding high-frequency line of the circuit arrangement are designated with reference numbers 6 and 6a. Furthermore, the circuit arrangement has a reception signal amplifier 8 which is connected to the antenna 13 and the settable damping device 5 via a section 6b of the high-frequency line which runs antiparallel to the section 6a of the high-frequency line. A detection device 9 and a setting device 11 are furthermore provided. In the example embodiment, the detection device 9 is connected to the section 6a of the high-frequency line 6 between the settable damping device 5 and the transmission signal amplifier 7. The signal level is therefore detected in transmission signals of the wireless mobile device 1 after the signals have been damped by the damping device 5, but before the signals are amplified by the transmission signal amplifier 7.

A signal output of the detection device 9 is connected to a signal input of the setting device 11. This is e.g. a controller for controlling the switching state of switches of the settable damping device 5. A corresponding example embodiment will be examined with reference to FIG. 3.

The circuit arrangement is coupled via the wireless signal-coupling device 3 to a transmit and receive antenna (not shown) of the wireless mobile device. This coupling can also be referred to as the air interface. However, materials which are preferably not electrically conducting may also be located between the antenna of the wireless mobile device 1 and the signal-coupling device 3.

Due to the section 6b with the reception signal amplifier 8, the circuit arrangement can be used not only for the transmission of transmission signals of the wireless mobile device 1, but also for the transmission of reception signals from a mobile network or from a mobile link. The reception signals are received by the antenna 13, are fed to the reception signal amplifier 8 which amplifies them and are then forwarded to the section 6 of the high-frequency line commonly used for transmission and reception signals. On the whole, a detection of the signal level takes place exclusively for the transmission signals (as described above).

Modifications of the circuit arrangement shown in FIG. 1 are possible. For example, the detection device 9 can detect the signal level in the section of the high-frequency line 6a between the transmission signal amplifier 7 and the antenna 13.

The signal damping caused by the coupling between the wireless mobile device 1 and the coupling device 3 may have different values, as mentioned above, particularly according to the position and alignment of the wireless mobile device 1 and according to the type of the wireless mobile device 1. Furthermore, in addition to the "additional signal damping" defined above, the signal damping caused by the circuit arrangement is also present, but this is normally constant and is identical for the different wireless mobile device types, positions and alignments.

The detection device 9 is connected via its detection signal output to the setting device 11. Particularly if the reaching or exceeding of the upper limit value or the reaching or understepping of the lower limit value has been detected, a corresponding detection signal is output from the detection device 9 to the setting device 11 which then sets the settable damping device 5 accordingly. The detection device 9 preferably outputs a detection signal continuously or repeatedly, in particular cyclically, said detection signal describing the respective state of the signal level. In a particularly preferred design, the detection device 9 outputs two such state signals to the setting device 11. One state signal contains the information indicating whether the upper limit value is reached or exceeded (first state) or whether the upper limit value is not reached (second state of the first state signal). Accordingly, the second state signal similarly has two states. The first state means that the lower limit value is reached or understepped. The second state means that this is not the case.

If a hysteresis of the signal level is to be achieved, this can be done, in particular, by means of the detection device 9. If, for example, the signal level rises and reaches or exceeds the upper limit value, the detection device 9 can signal this (e.g. by means of the first state signal) to the setting device 11. According to the invention, this will cause the resulting amplification to be reduced, in particular by increasing the signal damping caused by the damping device 5. The signal level will therefore be reduced once more. The detection device 9 can then be designed so that it signals an understepping of the upper limit value to the setting device 11 (for example by changing the state of the first state signal) only if a second upper limit value which lies below the first upper limit value is reached or understepped. An example embodiment is also described with reference to FIG. 7. The hysteresis can be implemented accordingly around the lower limit value.

Figure 2:
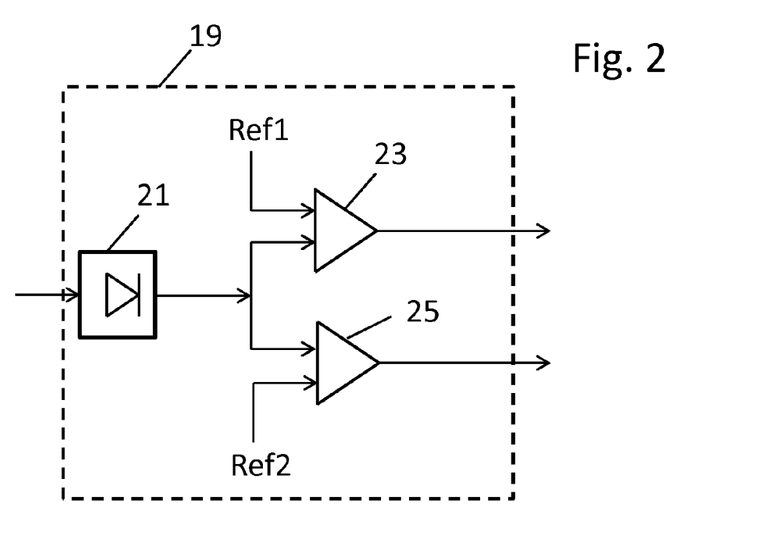
FIG. 2 shows an example embodiment of a detection device for detecting whether the signal level of a high-frequency signal reaches or exceeds an upper limit value and whether the signal level reaches or understeps a lower limit value, wherein the detection device may, in particular, be part of the circuit arrangement shown in FIG. 1.

FIG. 2 shows a schematic circuit arrangement for an embodiment of a detection device 19.

In particular, the design shown in FIG. 2 represents an implementation that was mentioned above in the description of FIG. 1 as a possible design of the detection device 9. The signal level to be detected is present on a rectifier 21 of the detection device 19 (on the left in FIG. 2). The rectifier 21 is connected via its output for the rectified HF signal to both a first comparator 23 and a second comparator 25. Both comparators 23, 25 have a further signal input in each case in order to receive a reference signal Ref1 and Ref2. The reference signals Ref1 and Ref2 correspond to the upper and lower limit value for the signal level. If the signal level therefore reaches or exceeds the upper limit value, the output signal at the output of the first comparator 23 changes in comparison with the state of the signal level below the upper limit value. In particular, the above-mentioned first state signal is therefore present at the output of the first comparator 23. Accordingly, the above-mentioned second state signal, for example, is present at the output of the second comparator 25. The hysteresis behavior can be achieved through a suitable design of the comparators, if necessary with the additional connection of further connection components (not shown).

Figure 3:
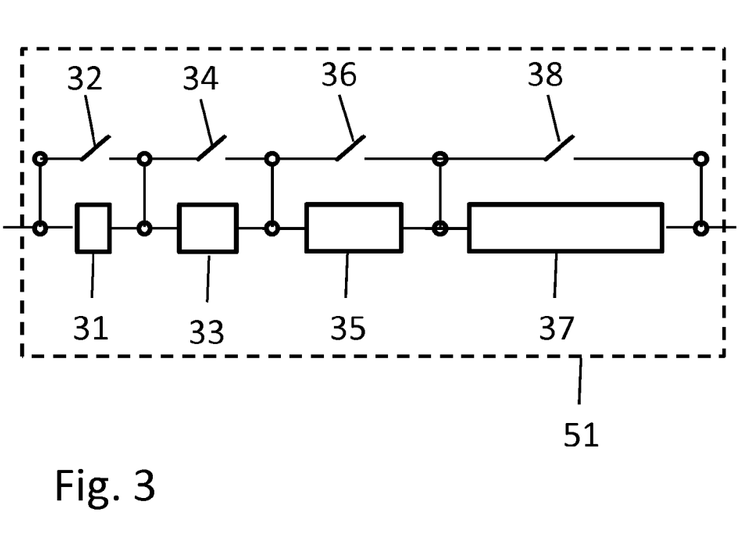
FIG. 3 shows an example embodiment of a damping device with a plurality of damping components which are individually connectable and disconnectable in each case by switching off or switching on a switch disposed parallel to the damping component, wherein the damping device may, in particular, be part of the circuit arrangement shown in FIG. 1.

The example embodiment shown in FIG. 3 of a damping device 51 which can be used, for example, as the damping device 5 in the circuit arrangement shown in FIG. 1, has a plurality of damping components 31, 33, 35, 37 connected in series with one another, wherein the number and damping effect of the damping components may vary in different designs of the damping device. In the example embodiment, a first damping component 31 is shown which has half the damping effect of the next following damping component 33, etc. In the example embodiment, the damping component 31 therefore has ⅛ of the damping effect of the fourth damping component 37. The third damping component 35 has half the damping effect of the damping component 37 and double the damping effect of the second damping component 33.

A bypass line in which a switch 32, 34, 36, 38 allocated to the respective damping component 31-37 is located is disposed in each case parallel to each of the damping components 31-37. In the activated state of the respective switch 32-38, the allocated damping component is inactive, since the bypass line is switched through and a signal transmission that is undamped can therefore take place parallel to the damping component.

Corresponding control connections of the controllable switches 32, 34, 36, 38 are not shown in FIG. 3. The switches can be controlled by a corresponding setting device, e.g. the setting device 11 in FIG. 1, and can therefore be switched on or off via these control connections. It is thus possible to control the digital damping device 51 shown in FIG. 3 in a computerized manner and set any given damping values in steps of the damping effect of the first damping component 31 (referred to below as the value "1") up to fifteen times, i.e. up to the value "15". Furthermore, the value "0" can be set if all switches 32, 34, 36, 38 are closed.

Figure 4:
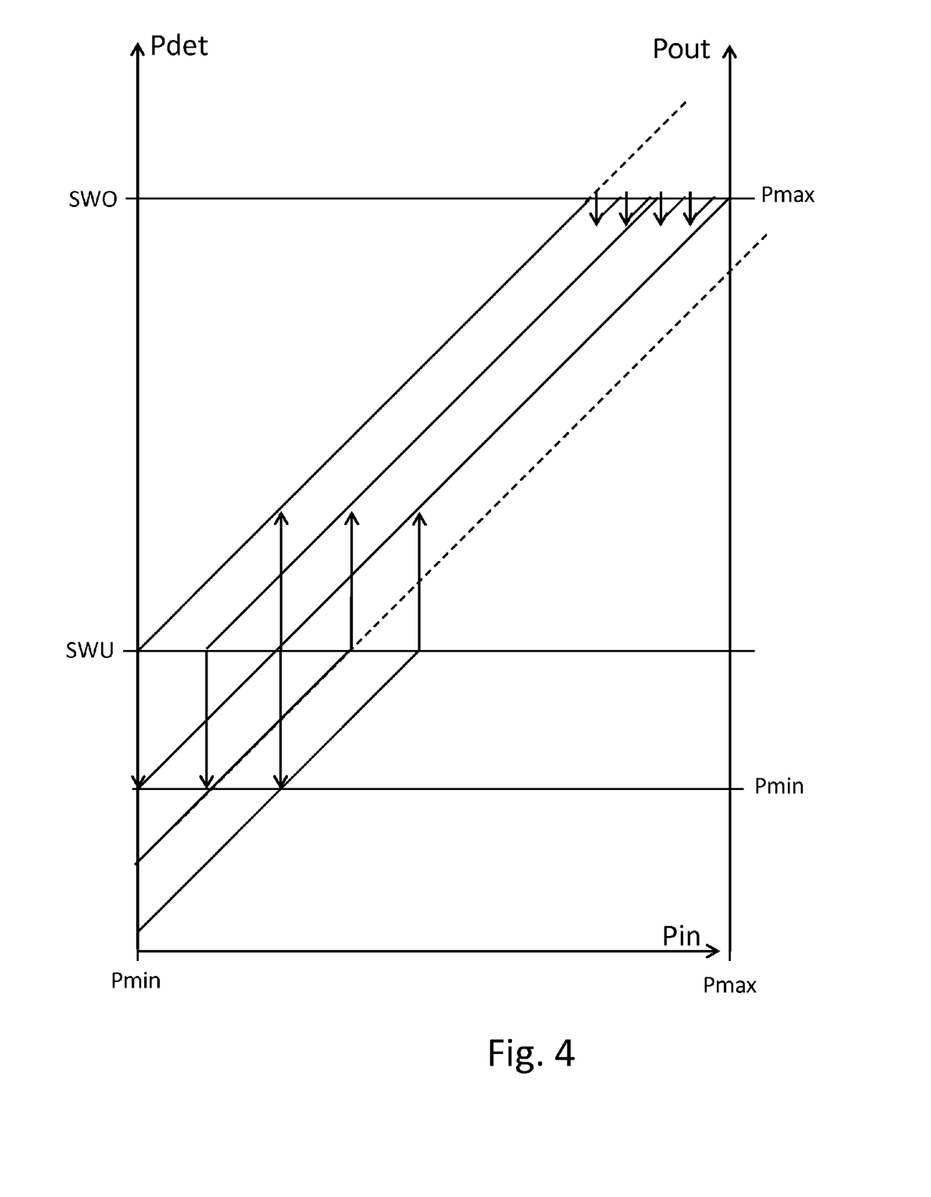
FIG. 4 shows a diagram in which values of the transmission power of a wireless mobile device are plotted on the x-axis and values of the output power at the signal output of a circuit arrangement and values of the signal level of the wireless mobile device on a detection device of the circuit arrangement are plotted in parallel in two different scales on the y-axis, wherein a family of curves comprising straight lines running parallel to one another with a positive gradient is furthermore shown in the diagram, of which the family of parameters is the additional signal damping of the circuit arrangement in combination with the wireless mobile device.

The diagram shown in FIG. 4 shows the input power or the input signal level Pin on the x-axis, wherein, in the case of the transmission of transmission signals of a wireless mobile device connected to the circuit arrangement, the input power Pin is the transmission power of the transmission signals on the transmit antenna of the wireless mobile device. When the wireless mobile device is operated in a mobile network, this transmission power Pin is limited by a minimum value Pmin and by a maximum value Pmax according to the rules of the respective mobile standard.

The output power Pout of the circuit arrangement, which must lie between the minimum value Pmin and the maximum value Pmax on a transmit antenna of the circuit arrangement according to the rules of the mobile standard, is plotted on the y-axis on the right. The signal level or the signal power Pdet on the detection device is plotted on the left on the y-axis. Since the detected power Pdet is either identical to the output power Pout or differs from it by the constant amount of the signal amplification of the signal amplifier, the detected power Pdet and the output power Pout can be plotted parallel to one another. The upper limit value SWO and the lower limit value SWU are shown on the left y-axis. The lower limit value SWU lies above the minimum value Pmin of the output power Pout.

The information relating to the minimum possible coupling loss between the circuit arrangement and the wireless mobile device and relating to the maximum possible coupling loss between the wireless mobile device and the circuit arrangement is used in the configuration of the circuit arrangement. In the case of the preferred design with the damping device, the difference between these limit values of the coupling loss is equal to the difference between the greatest settable signal damping of the damping device and the smallest settable signal damping of the damping device. For example, the total additional signal damping of the damping device, including the coupling loss, is 3 to 13 dB. In this case, the setting range for the signal loss of the damping device is selected from 0 to 10 dB. Furthermore, the constant signal amplification of the signal amplifier is defined as the amount corresponding to the maximum value of the additional signal loss, in the example embodiment therefore 13 dB. In the case of a settable signal amplification of the transmission signal amplifier without a settable damping component, the setting range for the signal amplification for the aforementioned case is selected from 3 to 13 dB. For an operation according to the GSM 900 mobile standard, for example, the minimum value Pmin of the input power Pin and the output power Pout is 5 dBm. The maximum value Pmax of the input power Pin and the output power Pout is 33 dBm. Other limit values apply accordingly in other mobile standards. In the specified example of GSM 900, the upper limit value SWO for the signal level Pdet is set to the value corresponding to the maximum value Pmax of the output power Pout (here: 20 dBm). This obviously applies to all other mobile standards also. The lower limit value for Pdet is set to the value 2 dBm if the detected signal level Pdet differs from the output power Pout by the signal amplification of the signal amplifier (e.g. 13 dB). If the signal level of the output power is measured, the lower limit value SWU would be set to the value 15 dBm. The minimum value Pmin for the output power Pout lies below the lower limit value SWU by the value (here in the example: 10 dB) with which the coupling loss can vary. This guarantees that a reduction of the input power Pin always results in a reduction of the output power Pout.

Figure 5:
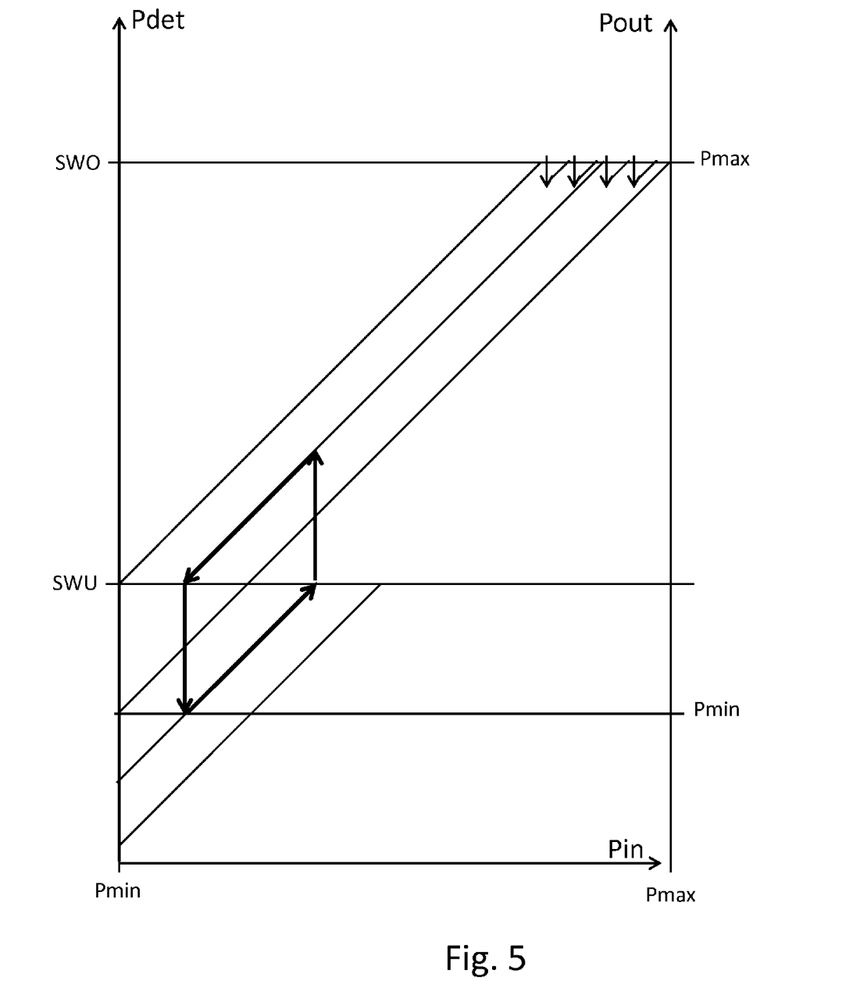
FIG. 5 shows a diagram similar to the diagram in FIG. 4 to show the increase and reduction in the resulting signal amplification or the signal level at the signal output of the circuit arrangement, with understepping of the lower limit value of the signal level and subsequent exceeding once more of the lower limit value of the signal level.
Figure 6:
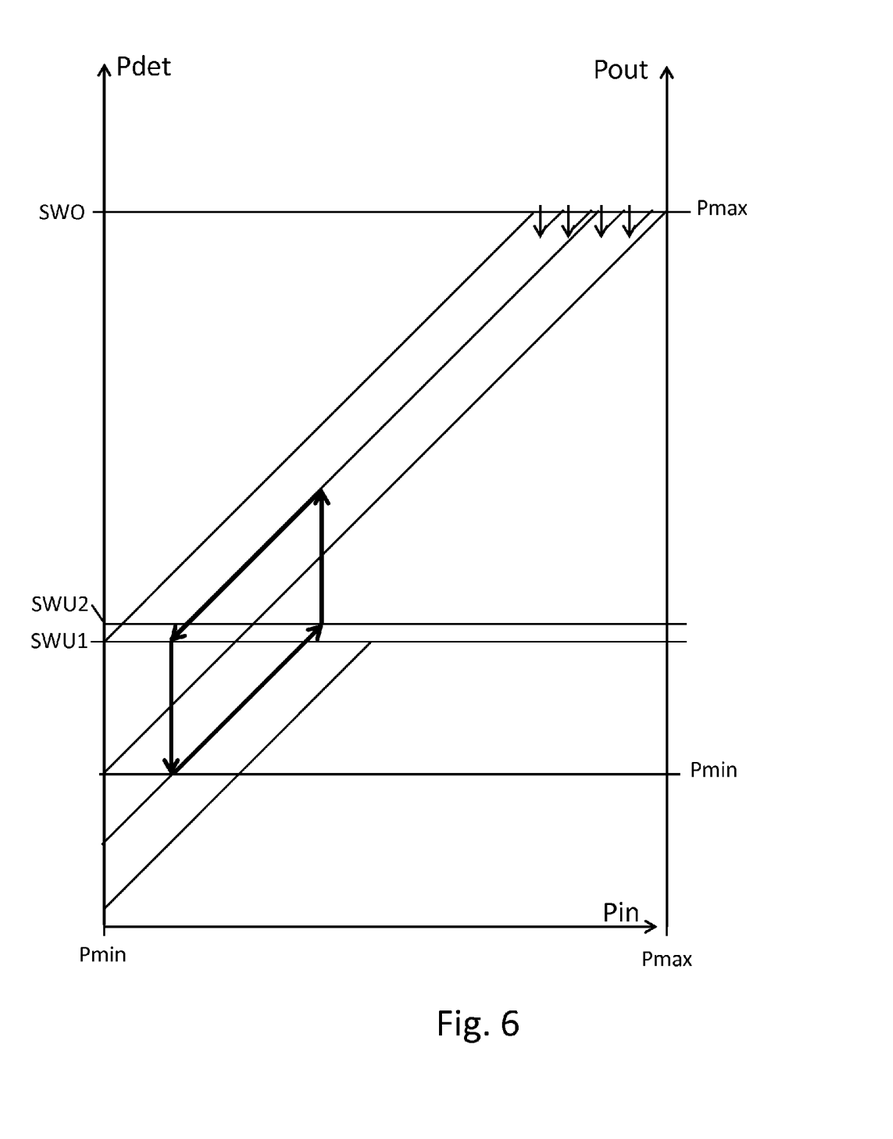
FIG. 6 shows a diagram similar to the diagram in FIG. 5, wherein a hysteresis of the resulting signal amplification or the signal level using two lower limit values is shown.

In the representation shown in FIG. 4 and also the following FIGS. 5 and 6, the x-axis and the y-axis are drawn to the same scale, i.e. the distances between the minimum power Pmin and the maximum power Pmax are equally great on both axes. Straight lines with the gradient 1 therefore run in the diagram at an angle of 45° in relation to the x-axis and the y-axis. A plurality of such lines are plotted. Some of these characteristics can run continuously in the y-axis area between the lower limit value SWU and the upper limit value SWO without the limits of the minimum value Pmin or the maximum value Pmax being exceeded on either the x-axis or the y-axis. However, some of these characteristics also run below the lower limit value SWU and, if extended up to the right, would exceed the maximum value Pmax for the input power Pin before the upper limit value SWO is reached. This behavior is represented by a broken line for one of these characteristics. Since this behavior is not permissible, an adaptation of the resulting signal amplification, in particular the signal damping of the damping device, is required.

The same applies accordingly to some characteristics which pass through between the lower limit value SWU and the upper limit value SWO without leaving the area on the x-axis or the y-axis defined by the minimum value Pmin and by the maximum value Pmax. However, these characteristics reach the upper limit value SWO and, if the input power Pin increased further, would go beyond the limit, i.e. the maximum value Pmax of the output power Pout would be exceeded. This behavior is also shown for one characteristic by a broken line.

The parameter of the different characteristics is the additional signal damping which is to be compensated. The further the characteristic runs up to the left, the smaller the additional signal damping of the circuit arrangement, including the coupling loss. Out of the characteristics shown, the characteristic located furthest up to the left corresponds to the smallest possible value of the additional signal damping. The characteristic located furthest down to the right corresponds to the greatest value of the additional signal damping. A characteristic is plotted, along which the value of the input power is equal to the output power Pout, i.e. the signal damping of the damping device is e.g. 0 and the signal amplification of the signal amplifier equalizes this at maximum additional signal damping, or a different additional signal damping prevails and the damping device is set to a value with a greater signal damping. This example illustrates that, apart from the edge of the characteristic field, the characteristics cannot be uniquely characterized by the additional signal damping or the set value of the resulting signal amplification. However, this knowledge is not required, since the resulting signal amplification is reduced in the inventive manner only if the upper limit value is reached or exceeded and the lower limit value is reached or understepped. A shift thereby takes place in the vertical direction (in the direction of the y-axis) from one characteristic to a parallel characteristic. A shift of this type is shown in the area of the upper limit value SWO and the lower limit value SWU by different arrows. In the area of the lower limit value SWU, an upward shift is also shown, since the resulting signal amplification is also intended to be increased once more as close as possible to the limit value, so that the wireless mobile device and the mobile station can negotiate the signal levels with one another over a greater range of level values with minimal interference and so that a reduction in the resulting amplification, or an increase in the signal damping, is again possible when the upper limit value SWO is reached. Upward-pointing arrows could be shown around the upper limit value SWO also in order to represent the corresponding measures for further increasing the resulting signal amplification if the signal level of the input power Pin again decreases.

A plurality of short, downward-pointing arrows are shown at the upper limit value SWO, the points of which end on short sections of further characteristics which extend to the upper limit value SWO. It is thereby indicated that the resulting signal amplification can be reduced in a plurality of small steps. This results in a particularly stable behavior of the output signal with the output power Pout depending on the input power Pin.

A corresponding behavior can also be generated at the lower limit value SWU. However, the longer arrows in FIG. 4 around the lower limit value SWU indicate that it is also possible to work with only one step of the change in the resulting signal amplification.

FIG. 5 shows an increase and a reduction in the resulting signal amplification around the lower limit value SWU. For example, the input power Pin can be reduced, wherein the state of the circuit arrangement is described e.g. by the second characteristic shown (viewed from the top left). Due to the reduction in the input power Pin, the state therefore changes according to the arrow running from the top left to the bottom right until the lower limit value SWU is reached. This characteristic could not be extended to the minimum value Pmin of the output power Pout without understepping the minimum value Pmin of the input power Pin. If the wireless mobile device therefore reduces its transmission power so that the input power is reduced to Pmin along this characteristic, the minimum Pmin of the output power Pout is reached and a further reduction in the transmission power of the wireless mobile device could not result in an even lower output power Pout. However, this is not permissible for the operation of wireless mobile devices. The resulting signal amplification is therefore already reduced on reaching the lower limit value SWU, in fact e.g. by a single step, so that the output power Pout is reduced to its minimum value Pmin. If the input power increases once more, the state is described by the arrow pointing up to the right in FIG. 5, ending at the lower limit value SWU. If the input power Pin has again increased to the extent that the output power has reached the lower limit value SWU, the reduction in the additional signal amplification is cancelled once more and a shift takes place in the vertical direction along the upward-pointing arrow, beginning at the lower limit value SWU.

A specific implementation of a hysteresis around the lower limit value, which could also be carried out accordingly around the upper limit value SWO, is now described with reference to FIG. 6. A second lower limit value SWU2 exists which lies above the first lower limit value SWU1, but, compared with the difference between the upper limit value SWO and the first lower limit value SWU1, lies close to the first lower limit value SWU1. "Close" means, not only in relation to the example embodiment from FIG. 6, in particular that the two lower limit values SWU or, in the corresponding case, the two upper limit values SWO are distanced from one another by a level difference that is smaller than 1/10 of the level difference between the upper limit value or the first upper limit value and the lower limit value or the first lower limit value, preferably even less than 1/20 or, particularly preferably, less than 1/50. Alternatively or additionally, "close" means, in particular, that the two upper limit values and/or the two lower limit values lie at most 4 dB, preferably at most 3 dB and, particularly preferably, at most 2 dB apart from one another.

The hysteresis already described with reference to FIG. 5 is slightly modified by the two lower limit values SWU1 and SWU2. If the input power Pin is reduced, corresponding to the behavior according to the arrow pointing from the top right to the bottom left, and the first lower limit value SWU1 is reached, the resulting signal amplification is reduced, as shown by the vertically downward-pointing arrow. However, if the input power Pin is again increased and reaches the area of the lower limit values SWU1, SWU2, the resulting signal amplification is increased once more only if the second, higher-placed lower limit value SWU2 is reached. The resulting signal amplification can thereby be prevented from being increased once more in a stepwise manner even if the lower-placed, first lower limit value SWU1 is reached due to the rising input power Pin, but the input power Pin then decreases significantly once more and the increase in the resulting signal amplification would therefore not yet have been necessary.

The concept of the two different limit values which was explained in the example shown in FIG. 6 is particularly advantageous particularly if the increase or reduction in the resulting signal amplification is carried out as an adaptation by a smaller amount than the amount shown in FIG. 6. If the amount of the modification of the resulting amplification is closer to the amount of the difference between the second and the first limit value (e.g. SWU2-SWU1), the concept of the two limit values then results in a significantly more stable behavior than if only a lower or upper limit value were present.

It is evident from FIGS. 4 to 6, that, in all states represented by characteristics which extend below the lower limit value SWU to the minimum value Pmin of the input power Pin, an increase in the resulting signal amplification preferably takes place if the input power Pin increases and therefore the lower limit value SWU is reached from below. This increase is preferably so great that a characteristic is reached on which the maximum value Pmax of the input power Pin not below the upper limit value SWO is reached. This offers the advantage that no further adaptations of the resulting signal amplification are required if the input power Pin rises further until the upper limit value SWO is reached.

Figure 7:
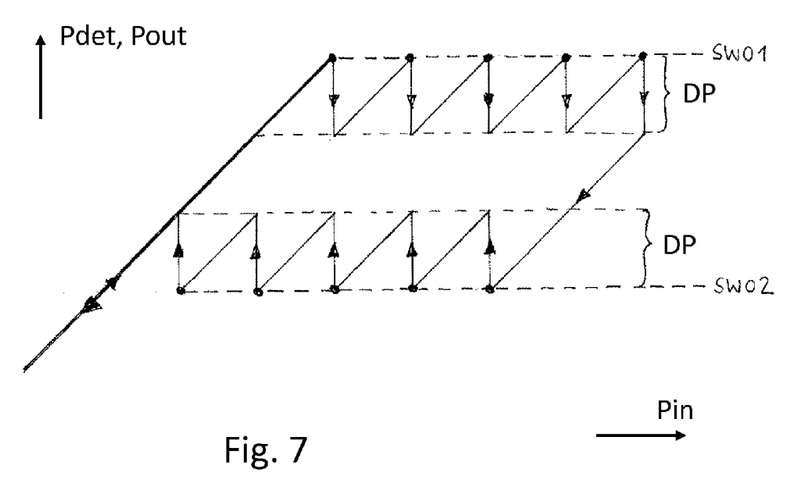
FIG. 7 shows an implementation of a hysteresis of the resulting signal amplification of the signal level using to upper limit values.

As also shown in FIG. 4 to FIG. 6, the input power Pin is plotted in the direction of the x-axis in the diagram of FIG. 7, whereas the output power Pout and the signal level Pdet are plotted in the direction of the y-axis. The line with a double arrow on the left of the figure, running diagonally from the bottom left to the top right, represents one of the lines which are already shown in FIG. 4 to FIG. 6 and which lie within the permissible range of the values for the input power Pin, the output power Pout and the signal level Pdet. If the signal level Pdet increases e.g. during the operation of the wireless mobile device (e.g. because the wireless mobile device is at a distance from the base station and therefore transmits at a higher transmission power), the signal level Pdet reaches the first upper limit value SWO1. With further increasing input power Pin, the resulting signal amplification is reduced by one step DP (e.g. by 1 dB). If the input power Pin further increases, the procedure is repeated: Whenever the signal level Pdet again reaches the first upper limit value SWO1, the signal level Pdet and therefore the output power Pout also are reduced by the step DP.

If the input power Pin again decreases, e.g. after five such stepwise reductions in the resulting signal amplification, the output power Pout is also reduced as shown by the line with an arrow shown on the right in FIG. 7, running from the top right to the bottom left. The second upper limit value SWO2 is reached. This triggers an increase in the resulting signal amplification, wherein the signal level Pdet is again increased by the step DP (e.g. by 1 dB). If the signal level Pdet falls further, this stepwise increase in the resulting signal amplification is repeated in each case when the second upper limit value SWO2 is reached. Finally, the characteristic shown on the left in FIG. 7, running from the top right to the bottom left, is again reached. The stepwise increase in the resulting signal amplification can then be ended and the arrangement is again in the state prior to the reaching of the first upper limit value SWO1.

This procedure is advantageous in that a situation wherein the additional damping is high and the wireless mobile device attempts to increase the transmission power (e.g.

because the wireless mobile device again moves away from its base station) can thus be prevented from occurring due to the increase in the additional damping (in particular due to an increase in the coupling loss of the above-mentioned coupling device in the event of a displacement of the wireless mobile device). If the resulting signal amplification is still low in such a situation, the first upper limit value SWO1 may possibly not be reached, i.e. the maximum possible output power is not reached. In the characteristic field in FIG. 4, this state is shown by the broken line on the right in FIG. 4.

It is therefore generally preferred that, after the first upper limit value SWO1 has been reached due to a rising signal level Pdet and a reduction in the resulting signal amplification (in particular due to an increase in the damping) and subsequent falling of the signal level Pdet to the second upper limit value SWO2, the resulting signal amplification is again increased (particularly in a stepwise manner) to the extent that it again has the value which it had before reaching the first upper limit value SWO1 before the signal level Pdet falls once more below the second upper limit value SWO2. The resulting signal amplification can optionally be increased even further before the signal level Pdet again falls below the second upper limit value SWO2.

The invention claimed is:

1. A circuit for compensating for signal damping while transmitting transmission signals of a wireless mobile device, the circuit comprising:
   a settable signal level amplification device having at least one signal amplifier for amplifying the transmission signals with a signal amplification generated by said signal amplifier;
   a setting device for setting a resulting signal amplification generated by said settable signal level amplification device;
   a detector configured to detect whether a signal level of the transmission signals of the wireless mobile device reaches or exceeds a predefined upper limit value and whether the signal level reaches or understeps a predefined lower limit value;
   said detector and said setting device are interconnected;
   if the upper limit value is reached or exceeded, said detector configured to cause said setting device to reduce the resulting signal amplification generated by said settable signal level amplification device; and
   if the lower limit value is reached or understepped, said detector configured to cause said setting device to reduce the resulting signal amplification generated by said settable signal level amplification device, and the circuit configuration is configured, in a further operation of the wireless mobile device, to output signals with an output power which are generated from the transmission signals of the wireless mobile device with a reduced signal amplification.

2. The circuit according to claim 1, further comprising a damping device being combined with said signal amplifier such that the transmission signals are amplified according to a resulting amplification which results from the signal amplification of said signal amplifier and from a signal damping generated by said damping device, wherein the signal damping generated by said damping device is settable by said setting device.

3. The circuit according to claim 2, wherein the signal amplification of said signal amplifier is constant.

4. The circuit according to claim 2, wherein said damping device is a digital damping device, the signal damping of said damping device can be increased and reduced in a stepwise manner by said setting device.

5. The circuit according to claim 1, wherein the upper limit value is a first upper limit value and the circuit is configured to increase the resulting signal amplification generated by said settable signal level amplification device if said detector detects that the signal level of the transmission signals of the wireless mobile device reaches or understeps a second predefined upper limit value which lies below the first upper limit value but above the lower limit value.

6. The circuit according to claim 1, wherein the lower limit value is a first lower limit value and the circuit is configured to increase the resulting signal amplification generated by said settable signal level amplification device if said detector detects that the signal level of the transmission signals of the wireless mobile device reaches or exceeds a second predefined lower limit value which lies above the first lower limit value but below the upper limit value.

7. The circuit according to claim 1, further comprising a signal-coupling device configured to receive radio transmission signals of a transmit antenna of the wireless mobile device and inject them into a high-frequency line for a line-connected transmission of the transmission signals.

8. A method for compensating for signal damping in a transmission of transmission signals of a wireless mobile device, which comprises the steps of:
   amplifying the transmission signals with a signal amplification generated by a signal amplifier;
   setting a resulting signal amplification generated by a settable signal level amplification device which has at least the signal amplifier depending on a signal level of the transmission signals of the wireless mobile device;
   detecting whether the signal level reaches or exceeds a predefined upper limit value and whether the signal level reaches or understeps a predefined lower limit value;
   reducing the resulting signal amplification generated by the settable signal level amplification device if the upper limit value is reached or exceeded; and
   reducing the resulting signal amplification generated by the settable signal level amplification device if the lower limit value is reached or understepped and, in a further operation of the wireless mobile device, signals which are generated from the transmission signals of the wireless mobile device with a reduced signal amplification are output with an output power.

9. The method according to claim 8, which further comprises damping the transmission signals by a damping device so that the transmission signals are amplified according to a resulting amplification which results from the signal amplification of the signal amplifier and from a signal damping generated by the damping device, and wherein the signal damping generated by the damping device is set depending on the signal level of the transmission signals of the wireless mobile device.

10. The method according to claim 9, wherein the signal amplification of the amplifier is kept constant.

11. The method according to claim 9, wherein the damping device has predefined, discrete values of the signal damping and the signal damping is increased and reduced in a stepwise manner according to differences in the discrete values.

12. The method according to claim 8, wherein the upper limit value includes a first upper limit value and the resulting signal amplification generated by the settable signal level amplification device is increased if it is detected that the signal level of the transmission signals of the wireless mobile device reaches or understeps a second predefined upper limit value which lies below the first upper limit value but above the lower limit value.

13. The method according to claim 8, wherein the lower limit value includes a first lower limit value and the resulting signal amplification generated by the settable signal level amplification device is increased if it is detected that the signal level of the transmission signals of the wireless mobile device reaches or exceeds a second predefined lower limit value which lies above the first lower limit value but below the upper limit value.

14. The method according to claim 8, wherein the transmission signals of a transmit antenna of the wireless mobile device are received as radio signals by a signal-coupling device and are injected into a high-frequency line for a line-connected transmission of the transmission signals and wherein a signal damping due to an injection of the radio signals is compensated by the settable signal level amplification device.

\* \* \* \* \*